(12) United States Patent
Na et al.

(10) Patent No.: US 8,866,187 B2
(45) Date of Patent: Oct. 21, 2014

(54) PHOTODETECTOR STRUCTURES INCLUDING CROSS-SECTIONAL WAVEGUIDE BOUNDARIES

(71) Applicant: Samsung Electronics Co., Ltd., Suwon-si (KR)

(72) Inventors: Kyoung Won Na, Seoul (KR); Pil-Kyu Kang, Anyang-si (KR); Seong Gu Kim, Pyeongtaek-si (KR); Yong Hwack Shin, Yeonsu-gu (KR); Ho-Chul Ji, Yongin-si (KR); Jung Hyung Pyo, Hwaseong-si (KR); Kyoung Ho Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/650,947

(22) Filed: Oct. 12, 2012

(65) Prior Publication Data

US 2013/0092980 A1   Apr. 18, 2013

(30) Foreign Application Priority Data

Oct. 14, 2011 (KR) .......................... 10-2011-0105237

(51) Int. Cl.
| | |
|---|---|
| H01L 31/102 | (2006.01) |
| H01L 31/0232 | (2014.01) |
| H01L 31/18 | (2006.01) |
| G02B 6/12 | (2006.01) |
| H01L 31/103 | (2006.01) |
| G02B 6/132 | (2006.01) |
| G02B 6/136 | (2006.01) |

(52) U.S. Cl.
CPC ...... *H01L 31/02327* (2013.01); *H01L 31/1808* (2013.01); *H01L 31/1804* (2013.01); *G02B 6/132* (2013.01); *G02B 6/12004* (2013.01); *G02B 6/136* (2013.01); *H01L 31/103* (2013.01)
USPC .......................................... 257/184

(58) Field of Classification Search
CPC ....................................................... H01L 31/00
USPC ........... 257/292, E31.058, E31.037, E31.063, 257/E31.115, E27.133, E25.032, 233, 185, 257/188, 190, 458, 184, 226–228, 214
See application file for complete search history.

(56) References Cited

U.S. PATENT DOCUMENTS

| | | | |
|---|---|---|---|
| 6,897,498 B2 | 5/2005 | Gothoskar et al. | |
| 2004/0188794 A1* | 9/2004 | Gothoskar et al. | 257/459 |

FOREIGN PATENT DOCUMENTS

| | | |
|---|---|---|
| JP | 2008-140808 | 6/2008 |
| KR | 1020060026847 A | 3/2006 |
| KR | 1020060094370 A | 8/2006 |
| KR | 1020060119359 A | 11/2006 |

* cited by examiner

*Primary Examiner* — David Vu
*Assistant Examiner* — Mouloucoulaye Inoussa
(74) *Attorney, Agent, or Firm* — Myers Bigel Sibley & Sajovec, P.A.

(57) ABSTRACT

A photodetector structure can include a silicon substrate and a silicon layer on the silicon substrate, that can include a first portion of an optical transmission medium that further includes a silicon cross-sectional transmission face. A germanium layer can be on the silicon substrate and can include a second portion of the optical transmission medium, adjacent to the first portion can include a germanium cross-sectional transmission face butt-coupled to the silicon cross-sectional transmission face.

14 Claims, 12 Drawing Sheets

PHOTODETECTOR STRUCTURES INCLUDING CROSS-SECTIONAL WAVEGUIDE BOUNDARIES

CROSS-REFERENCE TO RELATED APPLICATIONS

This application claims priority under 35 U.S.C. §119(a) from Korean Patent Application No. 10-2011-0105237 filed on Oct. 14, 2011, the disclosure of which is hereby incorporated by reference in its entirety.

FIELD

Embodiments of the inventive concept relate to photodetector structures and methods of fabricating the same, and more particularly, to photodetector structures including germanium.

BACKGROUND

To fabricate a photodetector that operates in a particular wavelength band, methods of crystallizing germanium on single-crystalline silicon deposited on an oxide insulating layer may be used.

However, crystallization carried out in this way may promote the formation of defects. For example, when germanium is crystallized on silicon having defects, the number of defects in germanium may also increase. Defects in the germanium may cause increases leakage current or dark current, which may adversely affect the characteristics of photo detectors.

It is known for photodetectors to include single crystalline germanium that is directly on a single-crystalline silicon layer on a silicon-on-insulator (SOI) substrate, so that the defects in germanium may be decreased.

SUMMARY

According to some embodiments of the inventive concept, there is provided a photodetector structure including a first silicon layer having a trench filled with a cladding material; a second silicon layer formed on the first silicon layer and the cladding material; and a germanium layer formed directly on the first silicon layer through single crystal growth to contact a side of the second silicon layer, at which the second silicon layer is etched.

The first silicon layer may be exposed through the etching of the second silicon layer, and the germanium layer may be formed on the first silicon layer that has been exposed through the etching.

According to other embodiments of the inventive concept, there is provided a photodetector structure including a first silicon layer having a trench filled with a cladding material; a second silicon layer formed on the first silicon layer and the cladding material; and a germanium layer formed in a trench, which is formed by etching the first silicon layer, through single crystal growth to be in direct contact with a top of the first silicon layer and to contact a side of the second silicon layer, at which the second silicon layer is etched.

According to further embodiments of the inventive concept, there is provided a photodetector structure including a first silicon layer having a trench filled with a cladding material; a second silicon layer formed on the cladding material; and a germanium layer formed in a trench, which is formed by etching the cladding material, to contact a side of the second silicon layer, at which the second silicon layer is etched.

The cladding material may be exposed through the etching of the second silicon layer, and the germanium layer may be formed in the trench, which is formed by etching the cladding layer that has been exposed through the etching, to contact the side of the second silicon layer.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF THE EMBODIMENTS ACCORDING TO THE INVENTIVE CONCEPT

Figure 1:
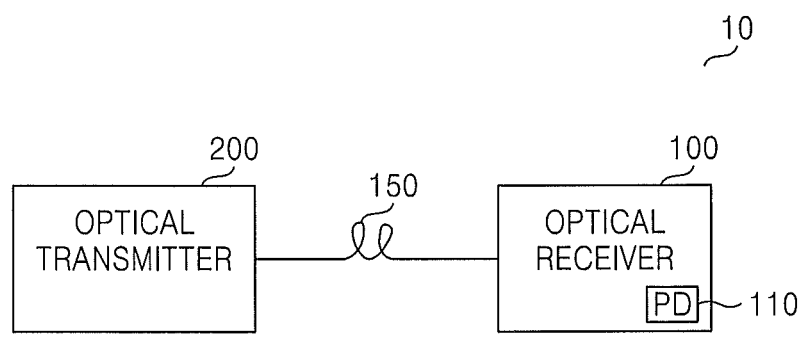
FIG. 1 is a schematic diagram of an optical communication system according to some embodiments of the inventive concept.

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic diagram of an optical communication system 10 according to some embodiments of the inventive concept. The optical communication system 10 includes an optical receiver 100, an optical transmitter 200, and a channel 150.

The optical transmitter 200 converts an electrical signal into an optical signal and transmits the optical signal to the optical receiver 100 through the channel 150. The optical receiver 100 converts the optical signal into an electrical signal. The optical receiver 100 includes a photodetector 110. The optical receiver 100 detects an optical signal using the photodetector 110 and converts it into an electrical signal. The channel 150 may be implemented using an optical fiber.

Figure 2:
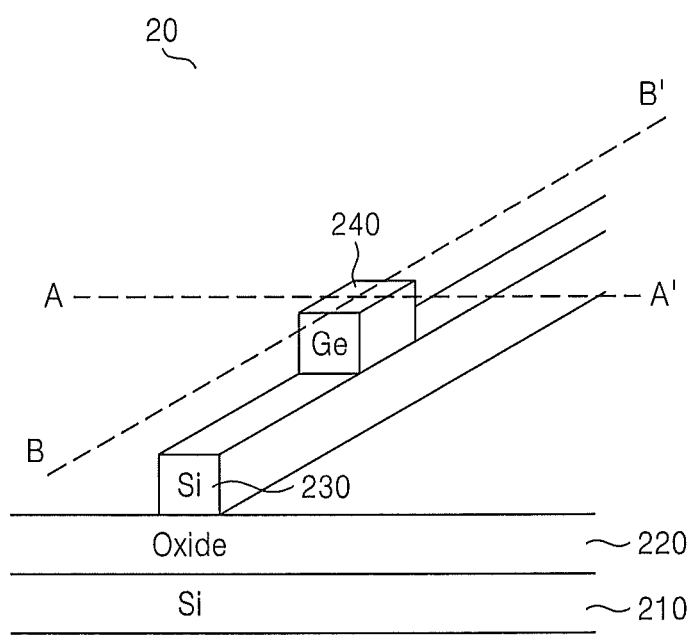
FIG. 2 is a diagram of a photodetector structure in a comparison example.

FIG. 2 is a diagram of a photodetector structure 20 in a comparison example. The photodetector 110 may have the photodetector structure 20 in the current comparison example. Referring to FIG. 2, the photodetector structure 20 includes a first silicon (Si) layer 210, an oxide layer 220, a second Si layer 230, and a germanium (Ge) layer 240, which are sequentially positioned as shown in FIG. 2. Although the oxide layer 220 is used in the current comparison example, the oxide layer 220 may be replaced with a layer made of any material having lower refractive index than Si.

The Ge layer 240 includes a low-temperature Ge layer and a high-temperature Ge layer in the current comparison example. However, the Ge layer 240 may be an alloy of Si and Ge compounded at a necessary ratio, or may be made of a single Ge layer instead of the low- and high-temperature Ge layers. The Ge layer 240 may also include single crystalline Ge and a polycrystalline Ge.

The second Si layer 230 corresponds to a waveguide. Incident light travels in a direction of the line B-B' with total reflection and when it reaches the Ge layer 240, it is absorbed by the Ge layer 240. The Ge layer 240 is connected with an electrode and absorbed light is output as an electrical signal to the electrode.

Since the second Si layer 230 is crystallized on the oxide layer 220, crystallization may be carried with defects. Accordingly, the Ge layer 240 may be crystallized on the second Si layer 230 with defects, and therefore, the number of defects in the Ge layer 240 may increase. As a result, leakage current or dark current increases, deteriorating the characteristics of the photodetector 110.

Figure 3:
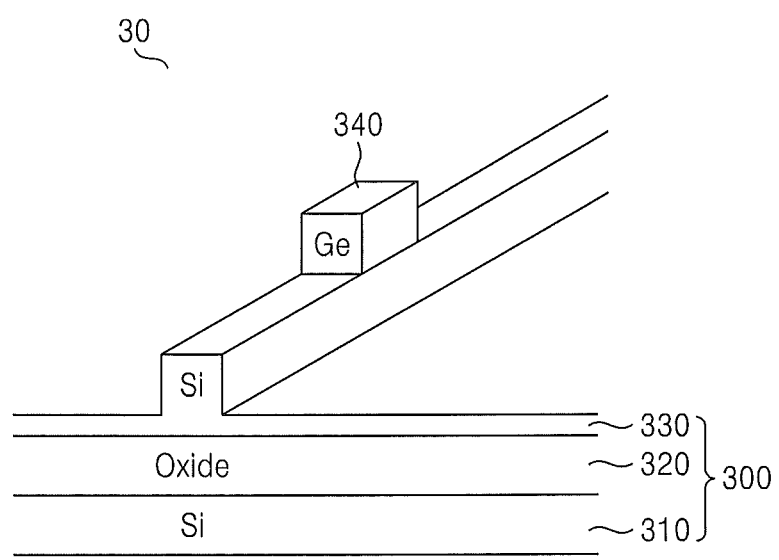
FIG. 3 is a diagram of a photodetector structure in another comparison example.

FIG. 3 is a diagram of a photodetector structure 30 in another comparison example. Referring to FIG. 3, the photodetector structure 30 includes a silicon-on-insulator (SOI) substrate 300, in which a first Si layer 310, an oxide layer 320 and a second Si layer 330 are stacked, and a Ge layer 340 thereon. The oxide layer 320 may be replaced with a different type of layer.

In the photodetector structure 30, since the Ge layer 340 is formed on the single-crystalline second Si layer 330 through single crystal growth using the SOI substrate 300, the Ge layer 340 may have less defects than the Ge layer 240 shown in FIG. 2. However, as appreciated by the present inventive entity, the SOI substrate 300 may be costly.

Figure 4:
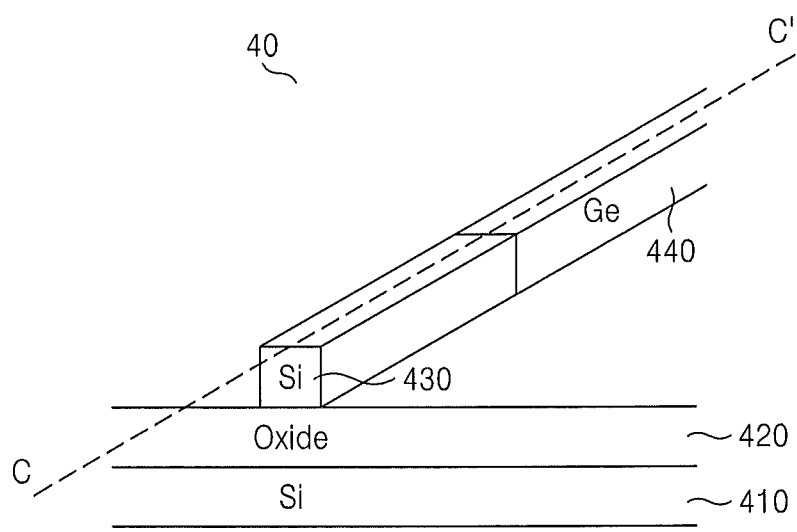
FIG. 4 is a diagram of a photodetector structure according to some embodiments of the inventive concept.

FIG. 4 is a diagram of a photodetector structure 40 according to some embodiments of the inventive concept. Referring to FIG. 4, the photodetector structure 40 includes a first Si layer 410, an oxide layer 420, a second Si layer 430, and a Ge layer 440. The first Si layer 410 and the oxide layer 420 are sequentially deposited. The second Si layer 430 is deposited on the oxide layer 420. The Ge layer 440 is joined to a side of the second Si layer 430 corresponding to a waveguide through cross-sectional etching and re-growth using butt-coupling. It will be understood that, in some embodiments according to the invention, butt-coupled can also include fiber optic mediums that are aligned to bring specially prepared cross-sectional transmission faces of two mediums into close contact with one another, but in some embodiments the mediums may not actually come into contact. In some embodiments according to the invention, "butt-coupled" can also include physical contact coupling where the two cross-sectional transmission faces of the mediums may have, for example, polished cross-sectional faces. It will be understood that the cross-sectional transmission faces are oriented to face in the direction in which light is configured to propagate via the waveguide that is provided by the mediums being butt-coupled.

The second Si layer 430 may be crystalline-grown through solid phase epitaxy (SPE) or lateral epitaxy growth (LEG).

The oxide layer 420 is used in the current embodiments, but it may be replaced with a layer made of any other material that has a lower refractive index than Si.

Figure 5:
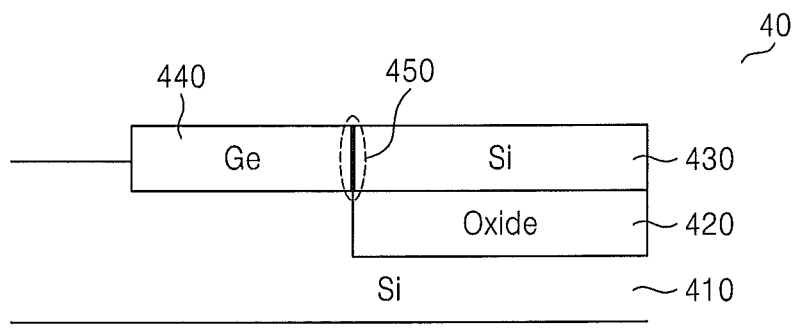
FIG. 5 is a cross-sectional view of the photodetector structure illustrated in FIG. 4, taken along the line C-C' according to some embodiments of the inventive concept.
Figure 6:
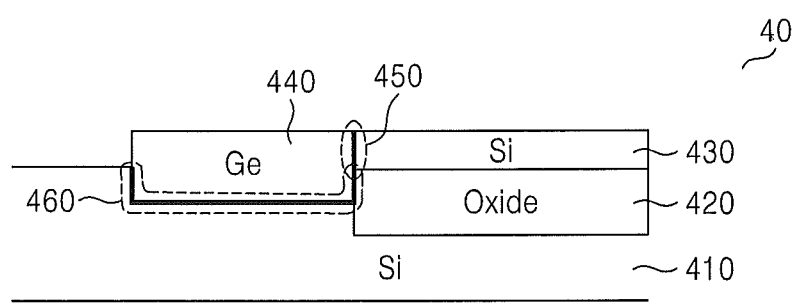
FIG. 6 is a cross-sectional view of the photodetector structure illustrated in FIG. 4, taken along the line C-C' according to other embodiments of the inventive concept.
Figure 7:
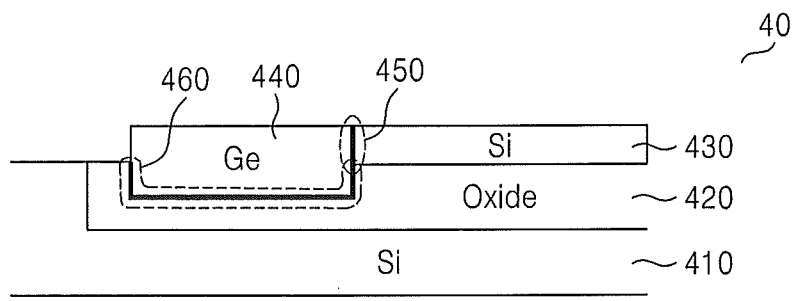
FIG. 7 is a cross-sectional view of the photodetector structure illustrated in FIG. 4, taken along the line C-C' according to further embodiments of the inventive concept.

FIGS. 5 through 7 are cross-sectional views of the photodetector structure 40 illustrated in FIG. 4, taken along the ling C-C' and show examples of the photodetector structure 40.

FIG. 5 is a cross-sectional view of the photodetector structure 40 illustrated in FIG. 4, taken along the line C-C' according to some embodiments of the inventive concept. Referring to FIG. 5, in order to fabricate the photodetector structure 40, a trench is formed in a bulk Si substrate, i.e., the first Si layer 410 and is filled with oxide to form the oxide layer 420.

The oxide layer 420 is used as a lower cladding layer of a waveguide. In the current embodiments, the trench is filled with oxide, but the inventive concept is not restricted to these embodiments. The trench may be filled with any material that has a lower refractive index than Si.

The second Si layer 430, e.g., an amorphous Si (a-Si) layer, formed on the oxide layer 420. In some embodiments according to the inventive concept, the a-Si is formed by deposition on the oxide layer 420. The second Si layer 430 is used as a core layer of the waveguide.

In the photodetector structure 40 illustrated in FIG. 5, the second Si layer 430 is formed on the first Si layer 410, but it is etched at a side 450 of the second Si layer 430 using cross-sectional etching in order to form the Ge layer 440 directly contacting the first Si layer 410, and then the Ge layer 440 is formed on the first Si layer 410 which has been exposed. When the Ge layer 440 is formed not on the top but at the side of the second Si layer 430, light absorption may be increased.

The Ge layer 440 may be formed on the first Si layer 410 through single crystal growth using a seed of a bulk Si substrate, i.e., the first Si layer 410. In this case, since the Ge layer 440 is formed through single crystal growth in direct contact with the bulk Si substrate, defects in the Ge layer 440 are reduced.

Thereafter, oxide is deposited on the first Si layer 410, the Ge layer 440, and the second Si layer 430, thereby forming an upper cladding layer and an electrode is connected to the Ge layer 440 in the photodetector structure 40, so that light incident to the waveguide with total reflection is output as an electrical signal.

FIG. 6 is a cross-sectional view of the photodetector structure 40 illustrated in FIG. 4, taken along the line C-C' according to other embodiments of the inventive concept. Referring to FIG. 6, in order to fabricate the photodetector structure 40, a trench is formed in a bulk Si substrate, i.e., the first Si layer 410 and is filled with oxide to form the oxide layer 420.

The oxide layer 420 is used as a lower cladding layer of a waveguide. In the current embodiments, the trench is filled with oxide, but the inventive concept is not restricted to these embodiments. The trench may be filled with any material that has a lower refractive index than Si.

The second Si layer 430, e.g., an a-Si layer, is formed on the oxide layer 420 using deposition. The second Si layer 430 is used as a core layer of the waveguide.

In the photodetector structure 40 illustrated in FIG. 6, the second Si layer 430 is formed on the first Si layer 410, but the second Si layer 430 is etched at the side 450 of the second Si layer 430 using cross-sectional etching and a portion 460 of the first Si layer 410 is etched to form a trench in order to form the Ge layer 440 directly contacting the first Si layer 410, and then the Ge layer 440 is formed on the first Si layer 410 which has been exposed. When the Ge layer 440 is formed not on the top but at the side of the second Si layer 430, light absorption can be increased.

The photodetector structure 40 illustrated in FIG. 6 is different from that illustrated in FIG. 5 in that the Ge layer 440 is partially buried in the first Si layer 410.

The Ge layer 440 may be formed on the first Si layer 410 through single crystal growth using a seed of a bulk Si substrate, i.e., the first Si layer 410. In this case, since the Ge layer 440 is formed through single crystal growth in direct contact with the bulk Si substrate, defects in the Ge layer 440 can be reduced.

Oxide is deposited on the first Si layer 410, the Ge layer 440, and the second Si layer 430, thereby forming an upper cladding layer and an electrode is connected to the Ge layer 440 in the photodetector structure 40, so that light incident to the waveguide with total reflection is output as an electrical signal.

FIG. 7 is a cross-sectional view of the photodetector structure 40 illustrated in FIG. 4, taken along the line C-C' according to further embodiments of the inventive concept. Referring to FIG. 7, in order to fabricate the photodetector structure 40, a trench is formed in a bulk Si substrate, i.e., the first Si layer 410 and is filled with oxide to form the oxide layer 420.

The oxide layer 420 is used as a lower cladding layer of a waveguide. In the current embodiments, the trench is filled with oxide, but the inventive concept is not restricted to these embodiments. The trench may be filled with any material that has a lower refractive index than Si.

The second Si layer 430, e.g., an a-Si layer, is formed on the oxide layer 420 using deposition. The second Si layer 430 is used as a core layer of the waveguide.

In the photodetector structure 40 illustrated in FIG. 7, the second Si layer 430 is formed on the first Si layer 410, but the second Si layer 430 is etched at the side 450 of the second Si layer 430 using cross-sectional etching and a portion 460 of the oxide layer 420, at which the second Si layer 430 is etched, is etched to form a trench, and then the Ge layer 440 is formed to be buried in the trench in contact with the second Si layer 430. When the Ge layer 440 is formed not on the top but at the side of the second Si layer 430, light absorption may be increased.

The photodetector structure 40 illustrated in FIG. 7 is different from those illustrated in FIGS. 5 and 6 in that the Ge layer 440 is partially buried in the oxide layer 420 so that a portion protrudes form an upper surface of the oxide layer 420.

Oxide is deposited on the first Si layer 410, the Ge layer 440, and the second Si layer 430, thereby forming an upper cladding layer and an electrode is connected to the Ge layer 440 in the photodetector structure 40, so that light incident to the waveguide with total reflection is output as an electrical signal.

Figure 8:
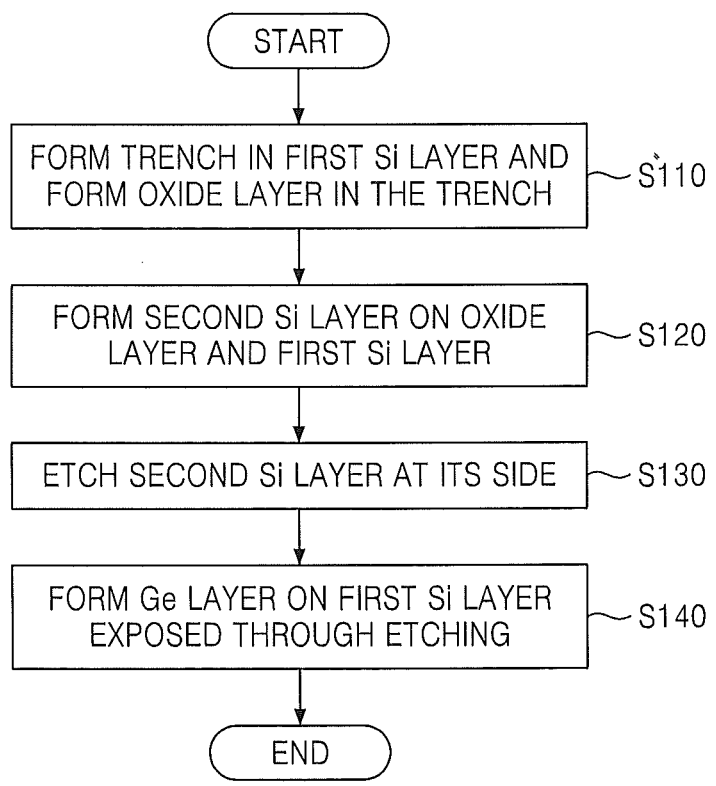
FIG. 8 is flowchart illustrating methods of fabricating the photodetector structure illustrated in FIG. 5.

FIG. 8 is flowchart illustrating methods of fabricating the photodetector structure 40 illustrated in FIG. 5. Referring to FIGS. 5 and 8, a trench is formed in the first Si layer 410 and the oxide layer 420 is formed in the trench in operation S110.

The second Si layer 430 is formed on the first Si layer 410 and the oxide layer 420 in operation S120. The second Si layer 430 may be formed using deposition.

The second Si layer 430 is etched at the side 450 in operation S130 to expose the first Si layer 410. The Ge layer 440 is formed on the first Si layer 410, which has been exposed, in operation S140. The side 450 of the second Si layer 430 may be a side at which first Si layer 410 can be exposed and the Ge layer 440 contacts the side 450 of the second Si layer 430.

Figure 9:
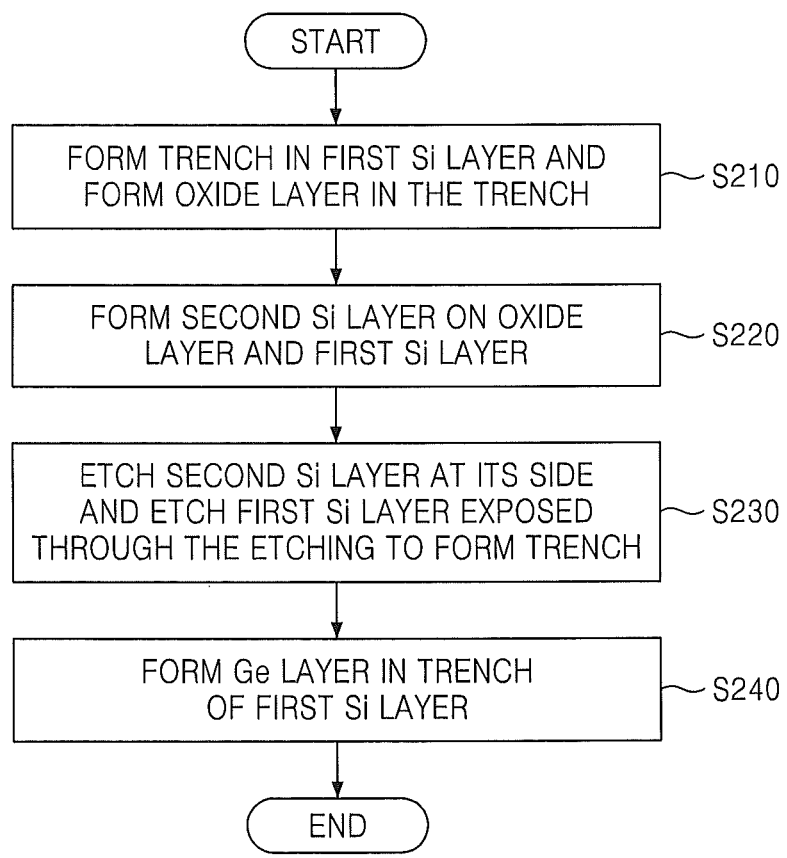
FIG. 9 is flowchart illustrating methods of fabricating the photodetector structure illustrated in FIG. 6.

FIG. 9 is flowchart illustrating methods of fabricating the photodetector structure 40 illustrated in FIG. 6. Referring to FIGS. 6 and 9, a trench is formed in the first Si layer 410 and the oxide layer 420 is formed in the trench in operation S210.

The second Si layer 430 is formed on the first Si layer 410 and the oxide layer 420 in operation S220. The second Si layer 430 may be formed using deposition.

The second Si layer 430 is etched at the side 450 and the first Si layer 410 exposed through the etching is etched to form a trench 460 in the first silicon layer 410 in operation S230.

The Ge layer 440 is formed in the trench 460 of the first Si layer 410 in operation S240. The side 450 of the second Si layer 430 may be a side at which first Si layer 410 can be exposed and the Ge layer 440 contacts the side 450 of the second Si layer 430 and the oxide layer 420.

Figure 10:
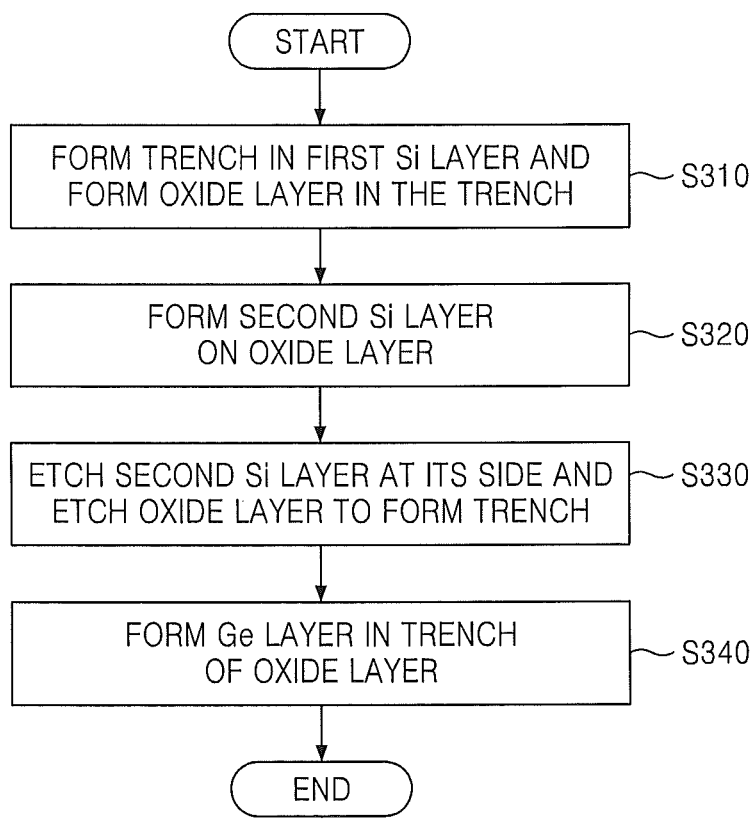
FIG. 10 is flowchart illustrating methods of fabricating the photodetector structure illustrated in FIG. 7.

FIG. 10 is flowchart of a method of fabricating the photodetector structure 40 illustrated in FIG. 7. Referring to FIGS. 7 and 10, a trench is formed in the first Si layer 410 and the oxide layer 420 is formed in the trench in operation S310.

The second Si layer 430 is formed on the oxide layer 420 in operation S320. At this time, the second Si layer 430 may be formed using deposition.

The second Si layer 430 is etched at the side 450 and the oxide layer 420 exposed through the etching is etched to form a trench 460 in operation S330.

The Ge layer 440 is formed in the trench 460 of the oxide layer 420 in operation S340. The Ge layer 440 contacts the side 450 of the second Si layer 430 and the oxide layer 420.

Figure 11:
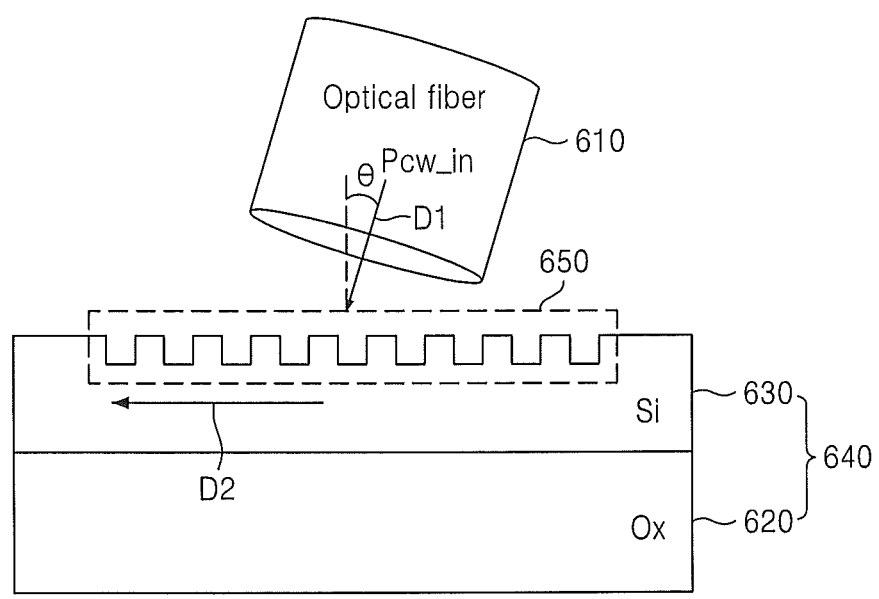
FIGS. 11 and 12 are diagrams for an explaining optical interface between an optical fiber and an optical waveguide according to some embodiments of the inventive concept.
Figure 12:
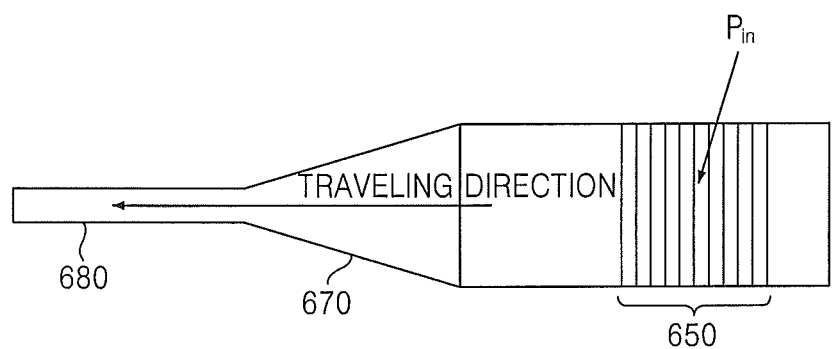

FIGS. 11 and 12 are diagrams for explaining the optical interface between an optical fiber 610 and a waveguide 640 according to some embodiments of the inventive concept. Referring to FIGS. 11 and 12, the waveguide 640 includes an oxide (Ox) layer 620 and a Si layer 630. The Si layer 630 has a light receiving portion 650, to which light is input through the optical fiber 610, in a ribbed pattern. The incident light can be input to the Si layer 630 by adjusting the gap between ribs and the depth of ribs. The light input to the Si layer 630 travels with total reflection since the Si layer 630 has a higher refractive index than the Ox layer 620. The Si layer 630 corresponds to a core layer and the Ox layer 620 corresponds to a cladding layer of a waveguide for the transmission of light. The top of the Si layer 630 may be covered with a cladding layer (e.g., an oxide layer).

Referring to FIG. 11, the optical interface locates the optical fiber 610 at an angle of θ to a vertical direction of the waveguide 640 to slant opposite to a direction in which an optical signal will be transmitted in order to decide a direction in which the optical signal travels in the waveguide 640. For instance, when the angle of θ is given so that incident light $P_{cw\_in}$ is input to the waveguide 640 in a first direction D1, the light $P_{cw\_in}$ travels in a second direction D2 in the waveguide 640. At this time, the angle of θ may be a predetermined angle, e.g., 8 to 10 degrees, but it is not restricted thereto.

As described above, when the optical interface is used, an incident light signal travels in a single direction, and therefore, as illustrated in FIG. 12 a waveguide 680 may also be formed in a single direction. A taper 670 may be provided between the light receiving portion 650 and the waveguide 680 to connect them. The optical interface having the structure illustrated in FIGS. 11 and 12 may be referred to as a slanted grating coupler.

According to some embodiments of the inventive concept, a photodetector structure and a method of fabricating the same improve the characteristics of a photodetector and are effective economically.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed:

1. A photodetector structure comprising:
    a first silicon layer having a trench filled with a cladding material;
    a second silicon layer formed on the first silicon layer and on the cladding material, the second silicon layer having an etched face; and
    a germanium layer formed directly on the first silicon layer through single crystal growth to butt-couple the etched face of the second silicon layer.

2. The photodetector structure of claim 1, wherein the first silicon layer is exposed through the etching of the second silicon layer, and the germanium layer is formed on the first silicon layer that has been exposed through the etching.

3. The photodetector structure of claim 2, wherein the second silicon layer is crystalline-grown through solid phase epitaxy (SPE) or lateral epitaxy growth (LEG).

4. The photodetector structure of claim 3, wherein the cladding material has a lower refractive index than silicon.

5. The photodetector structure of claim 4, wherein the cladding material comprises oxide.

6. The photodetector structure of claim 5, further comprising an electrode connected to the germanium layer.

7. The photodetector structure of claim 1, wherein the germanium layer is formed in a trench, which is formed by etching the first silicon layer, through single crystal growth to be in direct contact with a top of the first silicon layer and to contact a side of the second silicon layer, at which the second silicon layer is etched.

8. The photodetector structure of claim 7, wherein the first silicon layer is exposed through the etching of the second silicon layer, and the germanium layer is formed on the first silicon layer that has been exposed through the etching.

9. The photodetector structure of claim 2, further comprising an electrode connected to the germanium layer.

10. A photodetector structure comprising:
    a first silicon layer having a trench filled with a cladding material;
    a second silicon layer formed on the cladding material; and
    a germanium layer formed in a trench, which is formed by etching the cladding material, to contact a side of the second silicon layer, at which the second silicon layer is etched.

11. The photodetector structure of claim 10, wherein the cladding material is exposed through the etching of the second silicon layer, and the germanium layer is formed in the trench, which is formed by etching the cladding material that has been exposed through the etching of the second silicon layer, to contact the side of the second silicon layer.

12. The photodetector structure of claim 11, wherein the second silicon layer is crystalline-grown through solid phase epitaxy (SPE) or lateral epitaxy growth (LEG).

13. The photodetector structure of claim 12, wherein the cladding material comprises oxide.

14. The photodetector structure of claim 13, further comprising an electrode connected to the germanium layer.

* * * * *